(12) United States Patent
Mouttet

(10) Patent No.: US 7,589,310 B2
(45) Date of Patent: Sep. 15, 2009

(54) IMAGE CORRELATION SENSOR

(76) Inventor: Blaise Laurent Mouttet, 6380 Michael Robert Dr., Springfield, VA (US) 22150

( * ) Notice: Subject to any disclaimer, the term of this patent is extended or adjusted under 35 U.S.C. 154(b) by 365 days.

(21) Appl. No.: 11/607,974

(22) Filed: Dec. 4, 2006

(65) Prior Publication Data

US 2007/0085159 A1 Apr. 19, 2007

Related U.S. Application Data

(63) Continuation-in-part of application No. 11/446,223, filed on Jun. 5, 2006, now Pat. No. 7,488,950.

(51) Int. Cl.
*H01L 27/00* (2006.01)
*H01L 31/00* (2006.01)
*H01L 31/062* (2006.01)
(52) U.S. Cl. .............. 250/214.1; 250/208.1; 257/290
(58) Field of Classification Search ........... 250/208.1, 250/214.1, 206, 214 R, 239; 257/257, 258, 257/290–295; 382/312
See application file for complete search history.

(56) References Cited

U.S. PATENT DOCUMENTS

| | | | | |
|---|---|---|---|---|
| 3,786,263 | A | * | 1/1974 | Michon .................. 348/306 |
| 4,837,435 | A | | 6/1989 | Sakuhara et al. |
| 5,003,167 | A | * | 3/1991 | Arques ................... 250/208.1 |
| 5,008,833 | A | * | 4/1991 | Agranat et al. ............... 706/40 |
| 5,581,094 | A | * | 12/1996 | Hara et al. .................. 257/80 |
| 5,731,584 | A | * | 3/1998 | Beyne et al. ............... 250/374 |
| 6,023,530 | A | * | 2/2000 | Wilson ...................... 382/219 |
| 6,288,385 | B1 | * | 9/2001 | Miramonti et al. ....... 250/208.1 |
| 6,429,417 | B1 | * | 8/2002 | Street et al. .............. 250/214.1 |
| 7,042,003 | B2 | | 5/2006 | Jang et al. |
| 2002/0009238 | A1 | * | 1/2002 | Bird ........................ 382/312 |
| 2005/0236556 | A1 | * | 10/2005 | Sargent et al. ........... 250/214.1 |

* cited by examiner

*Primary Examiner*—Que T Le
*Assistant Examiner*—Jennifer Bennett

(57) ABSTRACT

A sensor includes an array of substantially parallel wires, radiant energy sensitive material formed adjacent the array of parallel wires, and output units connected to each of the wires and constructed to provide an analog correlation vector output responsive to radiant energy incident on the sensor. The sensor is constructed as an image sensing device suitable for applications such as pattern recognition and image tracking.

15 Claims, 5 Drawing Sheets excellent # IMAGE CORRELATION SENSOR

This application is a Continuation-In-Part of the U.S. patent application Ser. No. 11/446,223 entitled "Crosswire Sensor," filed Jun. 5, 2006 now U.S. Pat. No. 7,488,950.

FIELD OF THE INVENTION

The present invention pertains to a sensing device which may be used for a variety of sensing functions including pattern recognition, pattern comparison and image tracking.

BACKGROUND OF THE INVENTION

Array sensor technologies such as CCD or CMOS sensors have typically included the use of semiconductor or capacitive junctions formed from silicon substrates. However, new materials based on nanoparticulate matter or photosensitive molecular and polymer films provide an avenue for new sensor technologies which may provide several advantages over the conventional sensor technologies. U.S. patent application Ser. No. 11/446,223, which is incorporated by reference in its entirety, provides teachings of using such materials to construct sensor arrays for applications such as imaging and pattern recognition. The present patent application provides further embodiments of such a sensor.

SUMMARY OF INVENTION

A sensor includes an array of substantially parallel wires, radiant energy sensitive material formed adjacent the array of parallel wires, and output units connected to each of the wires and constructed to provide an analog correlation vector output responsive to radiant energy incident on the sensor. The sensor is constructed as an image sensing device suitable for applications such as pattern recognition and image tracking.

In one particular embodiment the sensor includes a first array of substantially parallel wires formed on a first substrate, a second array of substantially parallel wires formed on the first substrate at an intersecting angle with the first array of parallel wires, an input electrode formed on a second substrate, radiant energy sensitive material formed between the first and second substrates, and output units connected to each of the wires in the first and second arrays and constructed to provide analog correlation vector outputs responsive to radiant energy incident on the sensor.

DETAILED DESCRIPTION OF THE INVENTION

Figure 1B:
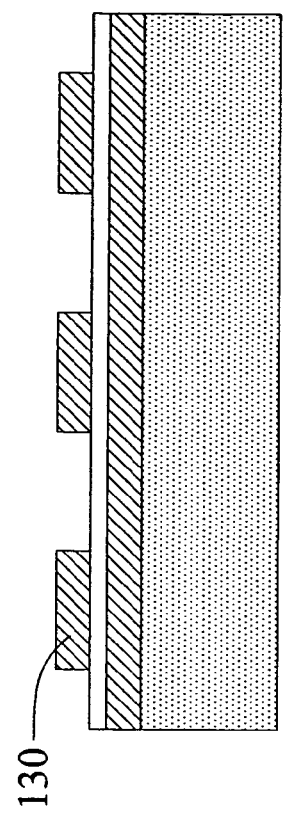
FIGS. 1a-1d illustrate fabrication steps for a first substrate used in forming one embodiment of the sensor.
Figure 1D:
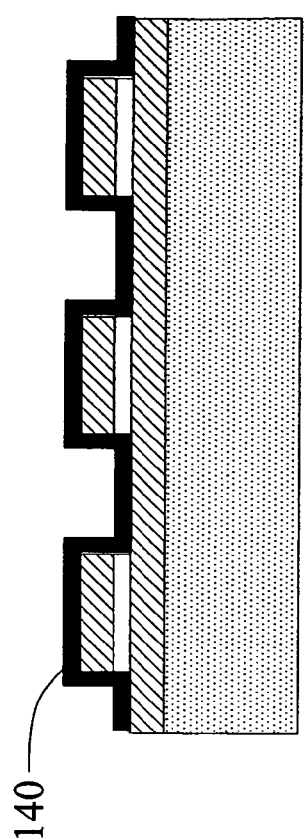
Figure 1A:
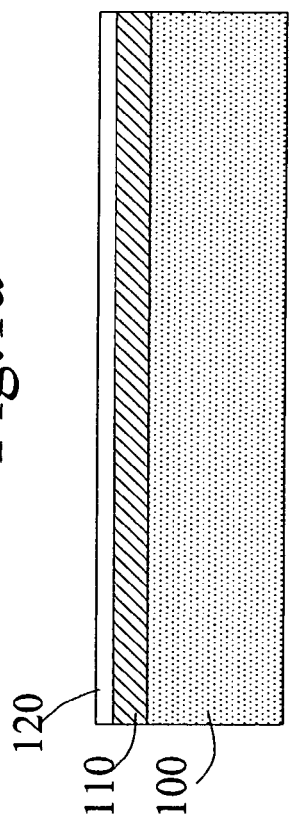
Figure 1C:
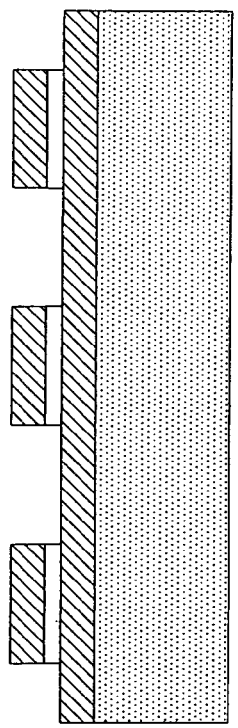

FIGS. 1a-1d illustrate fabrication steps for a first substrate used in forming one embodiment of the sensor. FIG. 1a illustrates a substrate 100 provided with a layer of metallic material patterned as a series of parallel wires 110. Substrate 100 may be made from a variety of insulating materials such as glass or plastic with either rigid or flexible characteristics depending on the desired application and fabrication method. An insulating layer 120 is coated over the substrate 100 and metallic wiring array 110. FIG. 1b illustrates a second array of parallel metallic wires 130 formed at a perpendicular, or at least intersecting, angle with the first array of parallel wires 110. The different layers 110, 120, 130 are preferably formed and patterned using a low cost process applicable at room temperature and pressure such as inkjet printing, silkscreen printing, roll to roll processing, imprinting or self-assembly. Alternatively, deposition, optical lithography, and other techniques more conventionally used by the semiconductor industry may be employed to form the layers 110, 120, 130. FIG. 1c illustrates post-etching of the insulating layer 120 using wiring 130 as a mask. FIG. 1d illustrates deposition of radiation sensitive material 140 above wiring 110 and 130. The radiation sensitive material may be material such as discussed in Sakuhara et al. U.S. Pat. No. 4,837,435 or Jang et al. U.S. Pat. No. 7,042,003 (both of which are incorporated by reference in their entirety) or take the form of any other known material sufficiently sensitive to photonic, electronic or ionic. radiation so as to be useful in sensor applications.

Figure 2A:
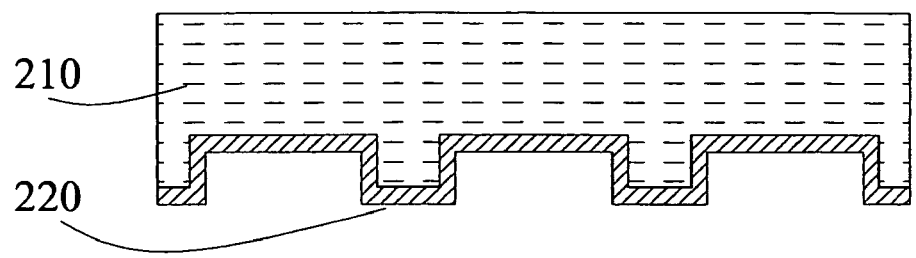
FIGS. 2a-2b illustrate assembly of the first substrate with a second substrate to form the sensor.
Figure 2B:
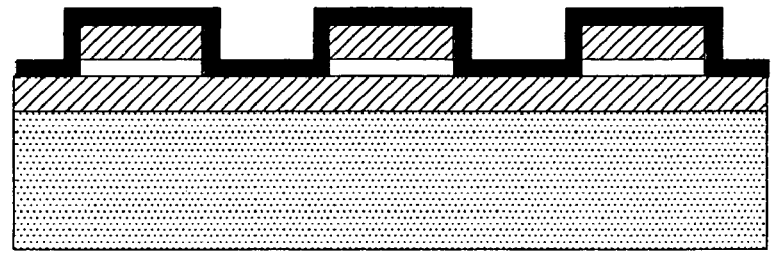
Figure 2B:
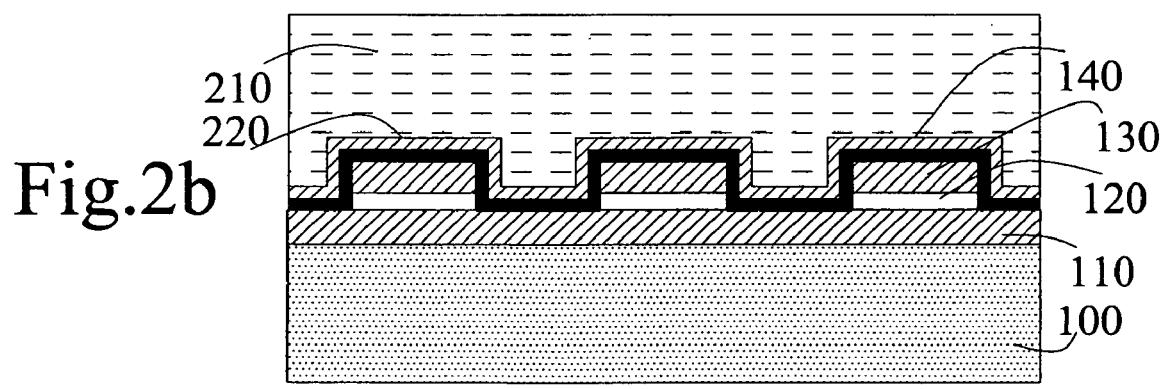

FIGS. 2a-2b illustrate assembly of the first substrate from FIG. 1d with a second substrate to form the sensor. The second substrate 210 may be formed from a reflective or opaque material and is coated with a conductive film 220 to serve as an input electrode. In one embodiment, substrate 100 is formed of a material transparent to incident radiation such as visible light while the surface of substrate 210 in contact with material 140 is reflective to visible light. In another embodiment, substrate 100 may be formed to be translucent with filtering properties so as to be selective to a particular type of radiation or frequency of light. As shown in FIG. 2a substrate 210 is molded or etched to be complementary to the surface geometry of the first substrate from FIG. 1d. so as to form a uniform gap thickness for the layer 140. However, if layers 120 and 130 are formed sufficiently thin with respect to the thickness of the layer 140 substrate 210 may instead be formed of uniform thickness.

Figure 3:
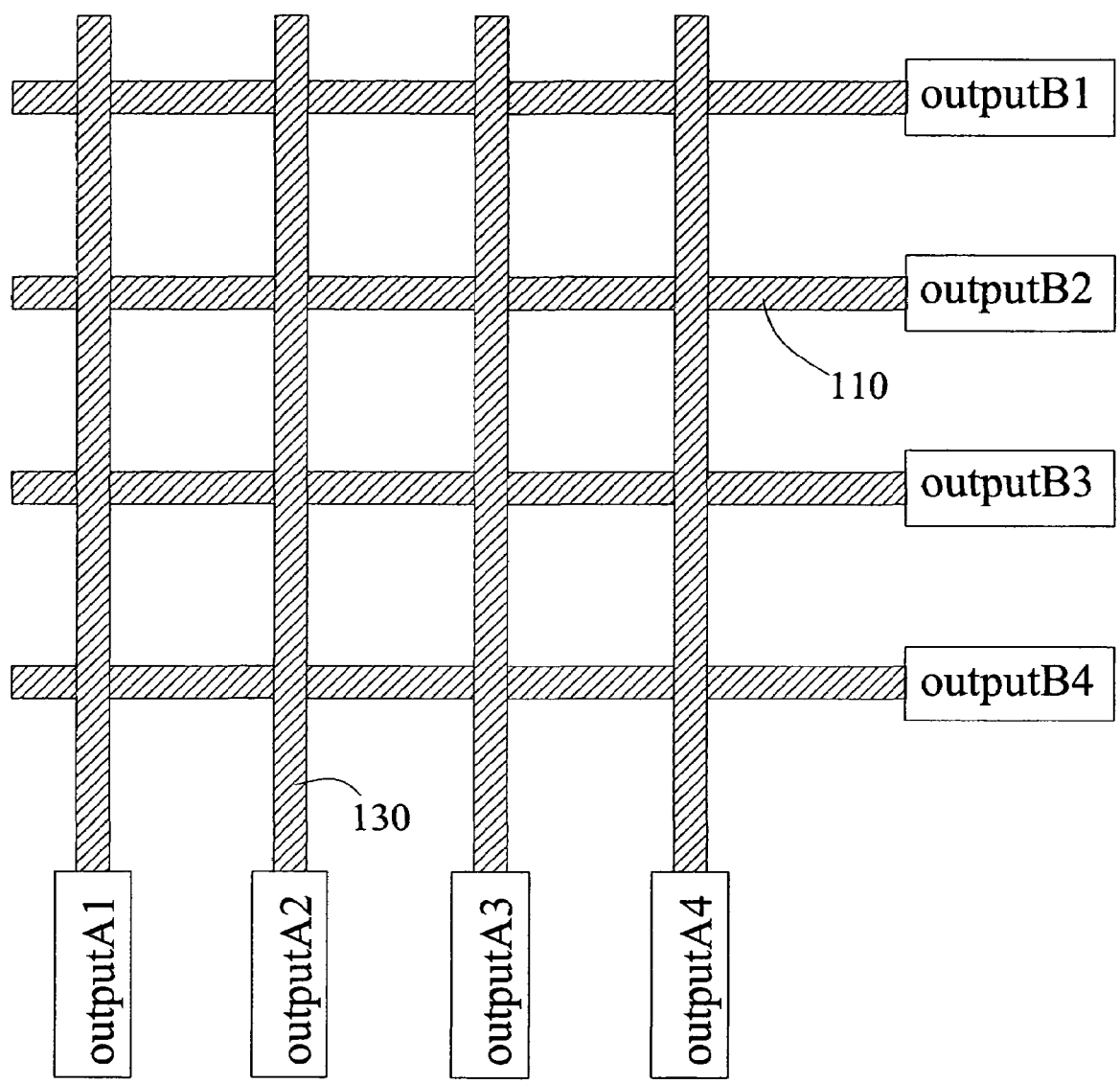
FIG. 3 illustrates a top view cross-section of wiring of the sensor connected to output circuits.

FIG. 3 illustrates an exemplary cross-section top view of wiring of a sensor constructed in accordance with the above described method connected to output circuits A1-A4 and B1-B4. Each output circuit is constructed to act as a summing amplifier for the corresponding row wiring 110 or column wiring 130 to produce an analog sum proportional to the electrical state of the corresponding row or column.

Figure 4:
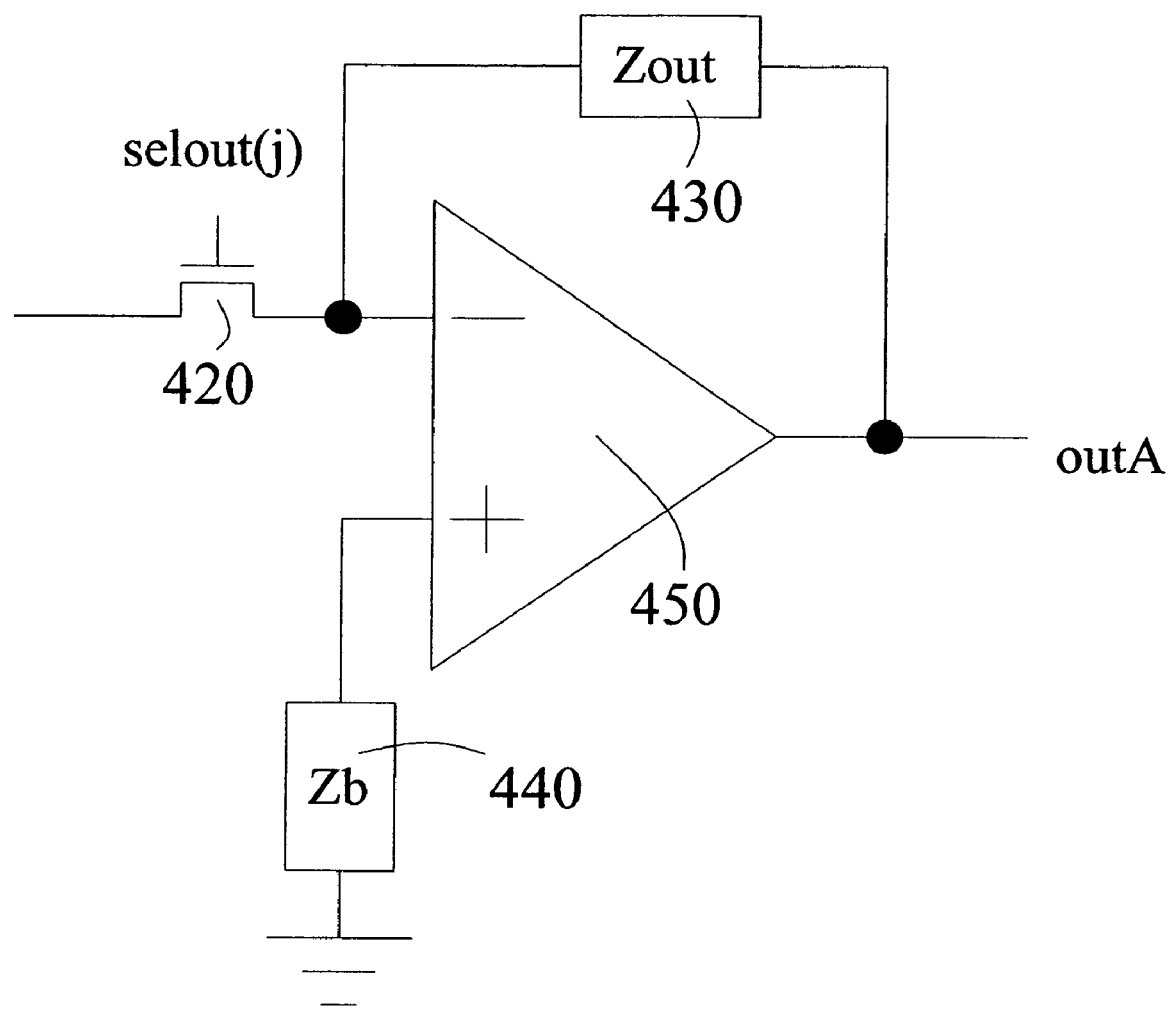
FIG. 4 illustrates an embodiment of the output circuits employing an op-amp functioning as a summing amplifier.

FIG. 4 illustrates an embodiment of the output circuits employing an op-amp functioning as a summing amplifier. Signal selouto) may be used to actuate the op-amp 450, including feedback impedance Zout 430 and balancing impedance Zb 440. The values of Zout and Zb for each output unit should be determined based on preliminary testing of the sensor to provide an identical low voltage output for each output unit under zero or minimal incident radiation conditions when voltage is applied input electrode 220. Under incident radiation the summing amplifier would produce an output voltage corresponding to the incident radiation of the corresponding row or column.

Figure 5A:
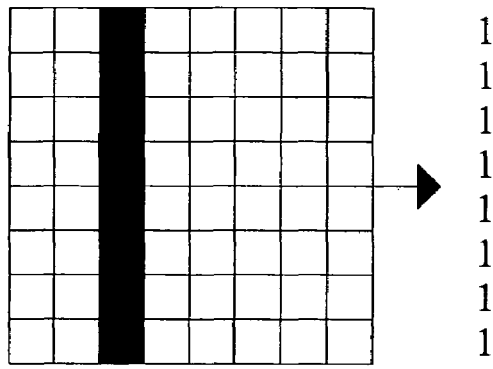
FIG. 5a-5d illustrate uses of the sensor in image and pattern sensing.
Figure 5B:
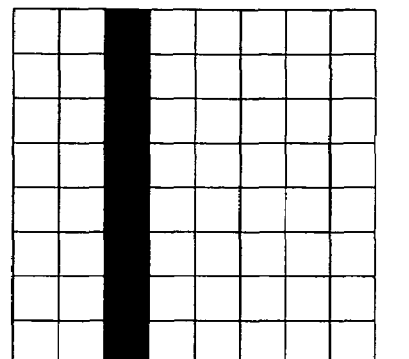

FIGS. 5a-5d illustrate exemplary uses of the sensor in image and pattern sensing. FIGS. 5a and 5b illustrate one example of the development of vertical and horizontal correlation vectors from a sensor array formed as an 8×8 matrix. In FIG. 5a, a voltage is applied to input electrode 220 and the output units associated with the rows are actuated. If the pattern of the incident radiation intensity affects only one column of the sensor as shown, a corresponding vertical correlation vector will be output consisting of a uniform intensity output. In FIG. 5b, a voltage is applied to input electrode 220 and the output units associated with the columns are actuated. If the pattern of the incident radiation intensity is the same as in FIG. 5a, an analog output will appear corresponding to the 3rd column. The array of column output units and array of row output units may be alternatively selected at sequential times to form an analog valued horizontal correlation vector (such as [0 0 8 0 0 0 0 0] in the example) and an analog valued vertical correlation vector (such as [1 1 1 1 1 1 1 1] in the example) associated with the image. The correlation vectors may be stored in a memory for later use or directly compared with a database of horizontal/vertical correlation vectors previously stored in memory corresponding to a database of correlation vectors associated with common shapes or figures. This allows for image identification to be performed more quickly then if individual digital pixels were to be compared. In the current example 16 analog values are formed (8 for the horizontal correlation vector and 8 for the vertical correlation vector) for comparison whereas 64 comparisons would be necessary if the results of each sensor element were analyzed independently. While comparison of analog values does not offer the precision of comparing binary or digital data, pattern recognition applications would typically require searches for the closest rather than an exact image match making comparisons of analog correlation vectors more reasonable.

Figure 5C:
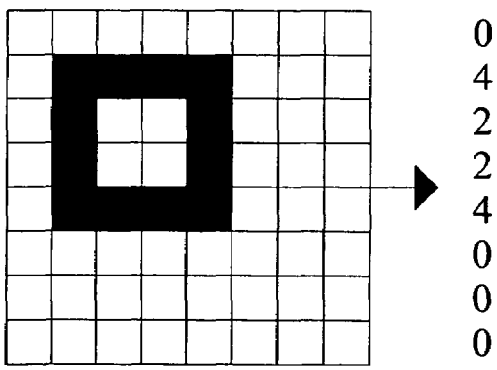
Figure 5D:
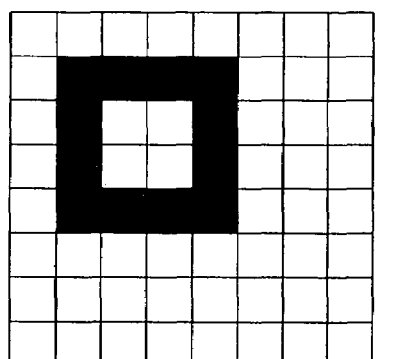

FIGS. 5c and 5d illustrate another example of image recognition in which both the position and shape of a pattern are identified. For example, a black square pattern, with a white square pattern of half the size embedded therein, may be identified with stored horizontal and vertical correlation patterns such as [(2 1 1 2), (2 1 1 2)]. Though the particular magnitude and position of a detected pattern using horizontal and vertical correlation vectors may differ from the stored value, this difference may actually be useful to ascertain the coordinates of the image and the relative intensity of the image. For example, the average analog value R of a correlation vector may be found using the algorithm $R=\Sigma f(n)/N$, the summation performed over $1 \leq n \leq N$ wherein n represents an ordinal number of the analog values in the correlation vector, f(n) represents the analog values corresponding to the ordinal numbers n, and N represents the maximum ordinal number (i.e. size) of the correlation vector. The mean coordinate X of a correlation vector may be found using the algorithm $X=\Sigma[nf(n)]/\Sigma f(n)$, the summations performed over $1 \leq n \leq N$. For a correlation vector (0 4 2 2 4 0 0 0), N=8, $\Sigma f(n)=12$, $\Sigma nf(n)=42$, R=1.5, X=3.5. For a correlation vector (0 0 2 1 1 2 0 0), N=8, $\Sigma f(n)=6$, $\Sigma nf(n)=27$, R=0.75, X=4.5. It can readily be seen that the relative mean coordinates X and average values R of detected and stored correlation vectors may be used in feedback control for image tracking and magnification control (for the given example the difference in mean coordinates 4.5−3.5=1 is indicative of the necessary repositioning while the ratio of the average values 0.75/1.5=0.5 is indicative of the magnification adjustment).

It is important to note that a horizontal and vertical correlation vector does not uniquely describe a particular pattern and can not be used to reconstruct a pattern. However, the use of a turret on which the sensor of the present invention is mounted may be rotated to find the correlation vector at different angles and expand the characterization of the image. In addition, such a turret could allow for only one array of parallel wires to be used in the manufacture of the sensor making manufacture simpler.

The use of the sensor of the present invention in pattern recognition may be combined with various feedback control systems such as used in robotics, automated vehicular control, etc. Feedback may also be provided to control preliminary optics to determine magnification and directional orientation (translation/rotation) of the image exposed to the sensor. For example, in the case of FIGS. 5c and 5d, the detected correlation vectors may be used to adjust the optics to center and enlarge the image to provide for higher resolution image analysis or to provide for image tracking such as tracking the position of a celestial body, a missile or projectile or for characterization of image patterns such as human facial characteristics, etc.

MODIFICATIONS/ALTERNATIVES

As discussed in the parent U.S. patent application Ser. No. 11/446,223, which is incorporated by reference in its entirety and to which the teachings of the present application may be applied, many modifications and alternatives are possible. The present invention is only limited by the following claims.

I claim:

1. A sensor comprising:
   a first array of substantially parallel wires formed on a substrate;
   an insulating layer coated over the substrate and the first array of substantially parallel wires;
   a second array of substantially parallel wires formed on the substrate over the insulating layer at an intersecting angle with the first array of parallel wires;
   radiant energy sensitive material deposited above both the first array of substantially parallel wires and the second array of substantially parallel wires;
   an input electrode formed above the radiant energy sensitive material; and
   output units connected to each of the wires in the first and second arrays and constructed to provide analog correlation vector outputs responsive to a voltage applied to the input electrode and radiant energy incident on the sensor.

2. The sensor of claim 1, wherein the radiant energy sensitive material is photosensitive material.

3. The sensor of claim 1, wherein the radiant energy sensitive material is a molecular film.

4. The sensor of claim 1, wherein the radiant energy sensitive material is a composite material including nanoparticles.

5. The sensor of claim 1, wherein the radiant energy sensitive material is sensitive to electrons or ions.

6. The sensor of claim 1, wherein the substrate includes a transparent material.

7. The sensor of claim 1, wherein the input electrode is formed on a second substrate which includes a reflective material.

8. An image analysis method comprising:
   providing the sensor as described in claim 1; and
   utilizing the sensor to produce both a horizontal correlation vector and a vertical correlation vector for a detected image.

9. The sensor of claim 1, wherein the substrate is translucent to incident radiation and acts as an optical filter.

10. The sensor of claim 1, wherein each of the output units is an operational amplifier functioning as a summing amplifier.

11. An image analysis method comprising:
    providing the sensor as described in claim 1; and
    utilizing the sensor to produce an analog correlation vector for a detected image.

12. The method of claim 11 further comprising comparing the analog correlation vector produced with a stored correlation vector corresponding to a target image.

13. An image analysis method comprising:
providing the sensor as described in claim 1; and
utilizing the sensor to produce both a horizontal correlation vector and a vertical correlation vector for a detected image.

14. An image analysis method comprising:
providing the sensor as described in claim 1;
rotating the sensor to different angles; and
utilizing the sensor to generate respective analog correlation vectors corresponding to the different angles.

15. The sensor of claim 1, wherein the input electrode is formed on a second substrate which is molded or etched to be complementary to a surface geometry of the substrate on which the first and second array of substantially parallel wires are formed so as to form a uniform gap thickness for the radiant energy sensitive material.

* * * * *